(12) United States Patent  
Mollazadeh Sardroudi et al.

(10) Patent No.: US 10,620,540 B2
(45) Date of Patent: Apr. 14, 2020

(54) ENCODED ILLUSTRATIONS

(71) Applicants: Mohammad Reza Mollazadeh Sardroudi, Qom (IR); Meysam Mashhadi, Qom (IR); Amir Mollazadeh Sardroudi, Qom (IR)

(72) Inventors: Mohammad Reza Mollazadeh Sardroudi, Qom (IR); Meysam Mashhadi, Qom (IR); Amir Mollazadeh Sardroudi, Qom (IR)

( * ) Notice: Subject to any disclaimer, the term of this patent is extended or adjusted under 35 U.S.C. 154(b) by 227 days.

(21) Appl. No.: 15/582,875

(22) Filed: May 1, 2017

(65) Prior Publication Data

US 2017/0235226 A1 Aug. 17, 2017

Related U.S. Application Data

(60) Provisional application No. 62/418,287, filed on Nov. 7, 2016.

(51) Int. Cl.
| | |
|---|---|
| *G06T 1/00* | (2006.01) |
| *G03F 7/20* | (2006.01) |
| *B42D 25/324* | (2014.01) |
| *B42D 25/405* | (2014.01) |
| *B42D 25/44* | (2014.01) |
| *B41M 3/14* | (2006.01) |

(52) U.S. Cl.
CPC ......... *G03F 7/2002* (2013.01); *B42D 25/324* (2014.10); *B42D 25/405* (2014.10); *B42D 25/44* (2014.10); *G06T 1/0028* (2013.01); *B41M 3/14* (2013.01)

(58) Field of Classification Search
CPC ..... G06T 1/0028; G03F 7/2002; B42D 25/44; B42D 25/405; B42D 25/324; B41M 3/14
See application file for complete search history.

(56) References Cited

U.S. PATENT DOCUMENTS

| | | | |
|---|---|---|---|
| 6,629,292 B1 * | 9/2003 | Corson | H01L 23/544 257/E23.179 |
| 6,770,348 B2 * | 8/2004 | Lee | B29C 33/3842 428/156 |
| 6,905,755 B1 * | 6/2005 | Nemeth | B41M 3/148 101/400 |
| 9,530,172 B2 | 12/2016 | Crisan et al. | |
| 2007/0110274 A1 * | 5/2007 | Brundage | G06T 1/0021 382/100 |

(Continued)

*Primary Examiner* — Zhihan Zhou
(74) *Attorney, Agent, or Firm* — Bajwa IP Law Firm; Haris Zaheer Bajwa

(57) ABSTRACT

Disclosed herein is a method for encoding an illustration on a target surface, where the illustration may be visible when light is shone on the surface from a light source with a predetermined position. The method may include converting the illustration into a grayscale illustration, specifying the position of the light source; generating a three dimensional surface having a grid of smaller surfaces thereon, where each smaller surface may represent a corresponding pixel of the grayscale illustration. Each smaller surface may be oriented with respect to the light source such that reflected light from each smaller surface has a reflection intensity equal to the light intensity of the corresponding pixel of the greyscale illustration; and making the target surface out of a material using the generated three dimensional surface as a template.

14 Claims, 13 Drawing Sheets

(56) References Cited

U.S. PATENT DOCUMENTS

| | | | |
|---|---|---|---|
| 2007/0110317 A1* | 5/2007 | Davis | B42D 25/29 |
| | | | 382/199 |
| 2007/0139520 A1* | 6/2007 | Loce | H04N 13/302 |
| | | | 348/60 |
| 2011/0187747 A1* | 8/2011 | McCarthy | H04N 1/32219 |
| | | | 345/634 |
| 2012/0069051 A1* | 3/2012 | Hagbi | G06T 19/006 |
| | | | 345/633 |
| 2014/0126766 A1* | 5/2014 | Crisan | G09C 5/00 |
| | | | 382/100 |
| 2014/0192281 A1* | 7/2014 | Smithwick | G02F 1/1313 |
| | | | 349/15 |
| 2017/0328841 A1* | 11/2017 | Luxton | G01N 21/4738 |

* cited by examiner

ENCODED ILLUSTRATIONS

CROSS REFERENCE TO RELATED APPLICATION

This application claims the benefit of priority from U.S. Provisional Patent Application Ser. No. 62/418,287, filed on Nov. 7, 2016, and entitled "ENCODING ILLUSTRATIONS AS HIDDEN 3D CARVINGS," which is incorporated herein by reference in its entirety.

TECHNICAL FIELD

The present application generally relates to encoded illustrations, particularly to encoded illustrations on a surface, and more particularly to encoded illustrations on a surface and methods for producing the same.

BACKGROUND

Different methods have been disclosed in the art for encoding images and illustrations or making invisible engravings on different materials. Hidden images and engravings may be utilized for producing ornamental and decorative articles or alternatively they may be utilized to create security documents and holographic images.

There is still a need in the art for methods of encoding or engraving hidden images on different surfaces for the purpose of creating decorative or security articles. The hidden or engraved images ideally may be only visible when for example looked at from a certain angle or when light is shone on them from a certain position and/or angle.

SUMMARY

An exemplary embodiment of the present disclosure comprises a method for encoding an illustration on a target surface, where the illustration may be visible when light is shone on the surface from a light source with a predetermined position and angle. The disclosed method may include: converting the illustration into a grayscale illustration; specifying the position of the light source; generating a three dimensional surface having a grid of smaller surfaces thereon, where each smaller surface may represent a corresponding pixel of the grayscale illustration. Each smaller surface may be oriented with respect to the light source such that reflected light from each smaller surface has a reflection intensity equal to the light intensity of the corresponding pixel of the greyscale illustration; and making the target surface out of a material using the generated three dimensional surface as a template.

According to some exemplary implementations, generating the three dimensional surface may include: rotating each smaller surface about an axis to reach an angle between the surface normal of each smaller surface and a line from the surface point to the light source, such that the reflection intensity of reflected light from each smaller surface at the reached angle may be equal to the intensity of the corresponding pixel of the grayscale illustration. The axis of each smaller surface may be defined on an edge of each smaller surface that is closer to the light source.

According to an exemplary implementation, making the target surface out of a material may include carving the material using the generated three dimensional surface as the template. According to another exemplary implementation, making the target surface out of a material may include three dimensional printing of the generated three dimensional surface. According to yet another exemplary implementation, making the target surface out of a material may include molding the target surface based on a mold created out of the generated three dimensional surface.

According to another example embodiment consistent with teachings of the present disclosure, a system for encoding an illustration on a target surface that may be visible when light is shone on the surface from a light source with a predetermined position. The system may include: a processor; a memory storing executable instructions for causing the processor to convert the illustration into a grayscale illustration having a plurality of pixels, where each pixel may have a light intensity; receive an initial position of the light source; divide the target surface into a grid of smaller surfaces; calculate an angle between the surface normal of each smaller surface and a line from the surface point to the light source such that the reflection intensity of reflected light from each smaller surface at the calculated angle may be substantially equal to the light intensity of the corresponding pixel of the grayscale illustration; generate a three dimensional surface from the smaller surfaces that may be oriented with the calculated angles with respect to the light source; and a surface formation unit that may be configured to form the target surface out of a material using the three dimensional surface as a template. The processor may be further configured to convert the three dimensional surface into a readable code by the surface formation unit.

The above general exemplary implementations may include one or more of the following features. The surface formation unit may include a computer-controlled cutting machine configured to receive the readable code and carve the three dimensional surface on the material. Alternatively, the surface formation unit may include a three dimensional printer configured to receive the readable code and print the three dimensional surface.

According to another exemplary embodiment, an article may have an illustration encoded thereon, wherein the illustration is visible when light is shone on the article from a light source with a predefined position, the article comprising a surface formed from a material based on a template. The template may be a three dimensional surface having a grid of smaller surfaces thereon. Each smaller surface may represent a corresponding pixel of a grayscale version of the illustration. Each smaller surface may be oriented with respect to the light source such that reflected light from each smaller surface has a reflection intensity substantially equal to the intensity of the corresponding pixel of the grayscale illustration.

According to an exemplary implementation, the surface may be formed by carving the template on the material. According to another exemplary implementation, the surface may be formed by three dimensional printing of the template.

DETAILED DESCRIPTION

Disclosed herein is an exemplary method for encoding illustrations on a surface where the illustrations are only visible to a viewer when light is shone onto the surface from a predetermined distance and angle. In this exemplary method a three dimensional pattern may be created on the surface, where each part of the three dimensional pattern may be oriented with respect to a light source with a different angle causing that part to reflect the light received from the light source with a specific reflection intensity. Different parts with different orientations on the surface may reflect the received light from the light source with a different reflection intensity, which means each part may reflect the received white light with a different shade of gray based on the orientation of that part with respect to the light source.

The intensity of the reflected light from each part of the patterned surface may be related to the orientation of each part of the surface with respect to the light source, i.e., the angle at which that part faces the light source, the distance of that part of the surface from the light source and the ambient light that may be shining on the surface. The exemplary method utilizes the aforementioned parameters to encode grayscale illustrations onto a surface. The surface may be divided into a number of smaller surfaces corresponding to the pixels of the grayscale illustration, then the orientation and distance of each smaller surface with respect to the light source may be manipulated such that each smaller surface may reflect the received light from the light source with a reflection intensity equal to the intensity of the corresponding pixel of that smaller part in the grayscale image. Therefore, a viewer who may be standing in front of the surface may see the encoded illustration on the surface when the light source shines light on the surface from its predetermined position and angle, and when the light source is off, then the illustration may not be clearly visible on the surface.

Figure 1:
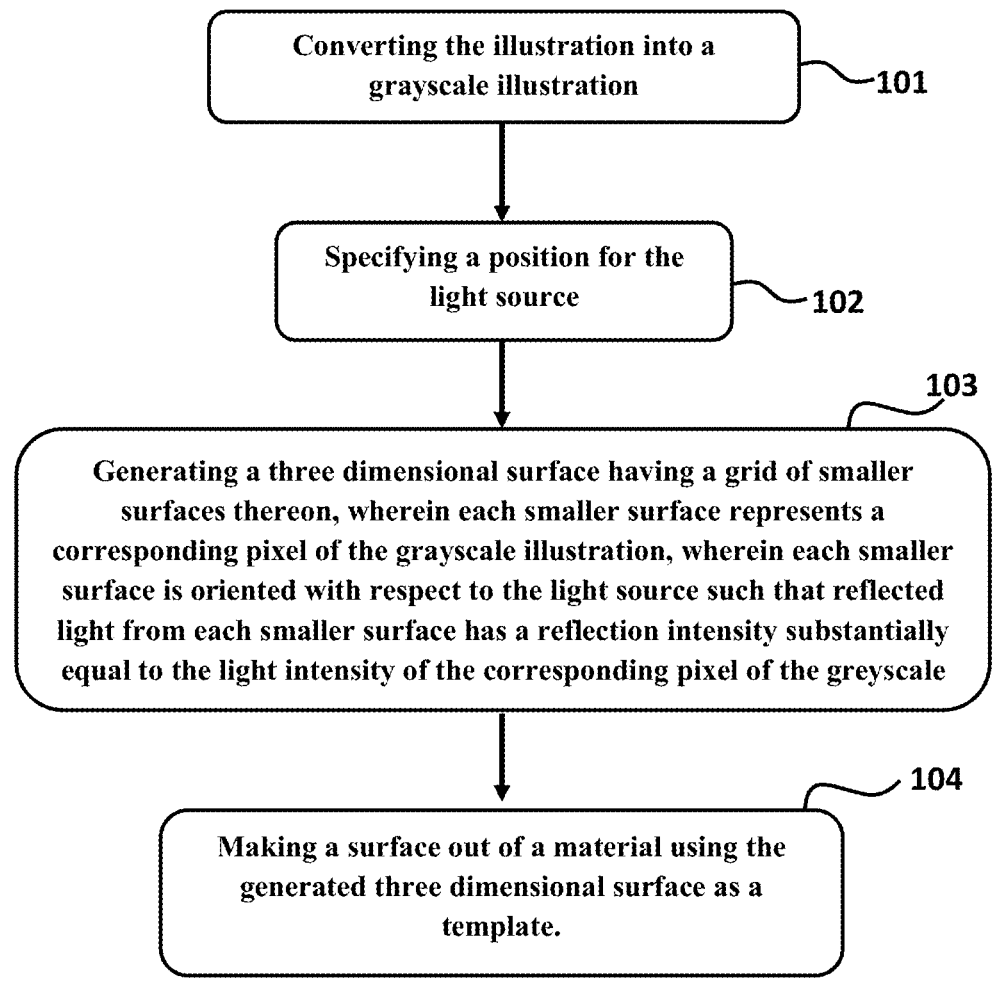
FIG. 1 illustrates a flowchart of a method for encoding illustrations on a target surface, consistent with one or more exemplary embodiments of the present disclosure.

FIG. 1 illustrates method 100 for encoding an illustration on a target surface consistent with one or more exemplary embodiments of the present disclosure, where the illustration may be visible to a viewer standing in front of the surface once light is shone on the target surface from a light source with a certain position. In one exemplary implementation, method 100 may include a step 101 of converting the illustration into a grayscale illustration in case the illustration is in a colored format; a step 102 of specifying the position of the light source that may include an x-coordinate and a y-coordinate specifying the position of the light source on the plane of the surface and a z-coordinate specifying the perpendicular distance of the light source from the plane of the surface; a step 103 of generating a three dimensional surface with a grid of smaller surfaces thereon, where each smaller surface may represent a corresponding pixel of the grayscale illustration, and each smaller surface may be oriented with respect to the light source such that reflected light from each smaller surface has a reflection intensity equal to the light intensity of the corresponding pixel of the grayscale illustration; and a step 104 of making the target surface out of a material using the generated three dimensional surface as a template.

With reference to FIG. 1, referring to step 101, a received illustration that is to be encoded by method 100 may be converted to a grayscale illustration. In a grayscale illustration or image, each pixel carries only a single intensity information and the illustration is composed of shades of gray, varying from black at the weakest intensity to white at the strongest intensity. The intensity of each pixel of a grayscale illustration or image may be expressed within a given range between a minimum and a maximum intensity. For example, grayscale images intended for visual display either on a screen or a printed medium may be stored with 8 bits per sampled pixel, which allows 256 different intensities corresponding to 256 different shades of gray. Therefore, the intensity of each pixel may be expressed within a given range between 0 (black) to 255 (white), inclusive. In another example, grayscale images may be stored with 16 bits per sampled pixel, which allows 65,536 different intensities corresponding to 65,536 different shades of gray. Different methods may be utilized to convert a color illustration to a grayscale illustration that may include but are not limited to methods such as colorimetric conversion to grayscale.

Figure 2A:
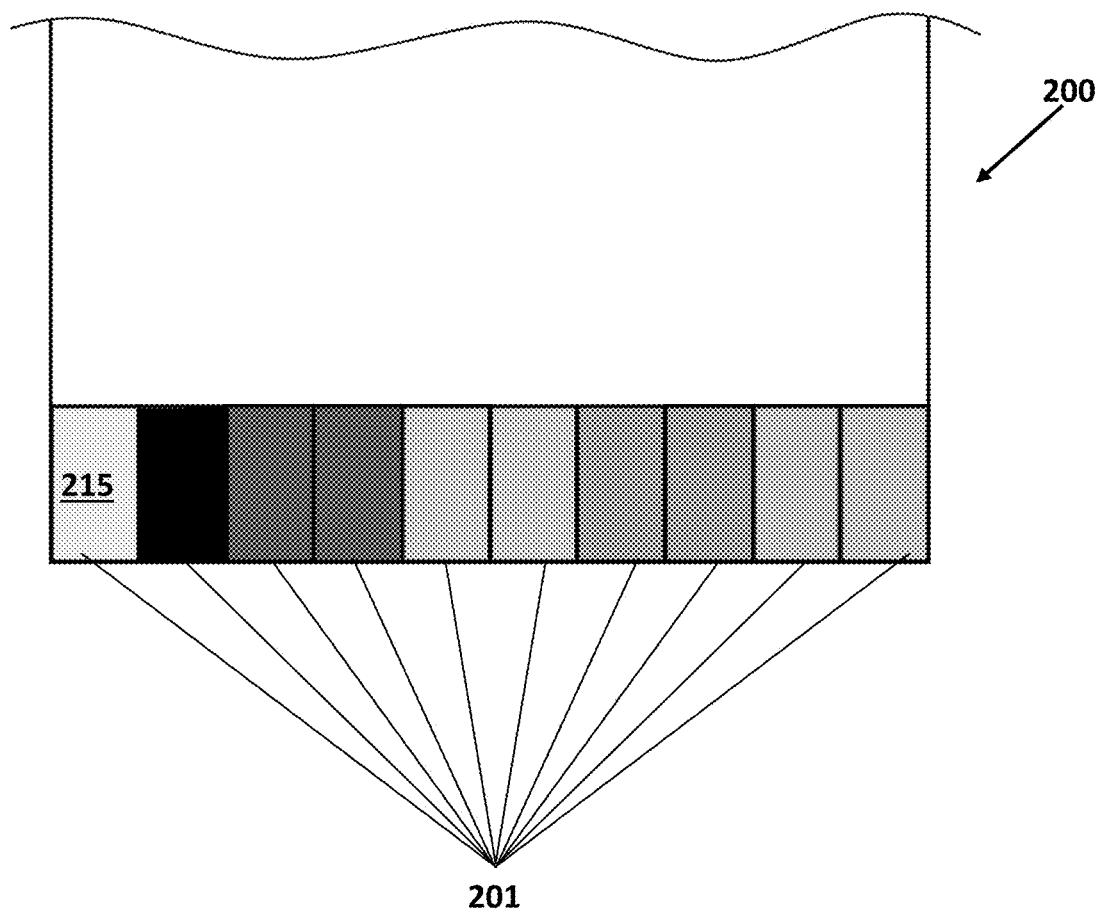
FIG. 2A illustrates an example of a grayscale illustration, consistent with one or more exemplary embodiments of the present disclosure.

Referring to FIG. 2A, an exemplary grayscale illustration 200 is shown. For simplicity only 10 pixels 201 of illustration 200 is shown in FIG. 2A. Each pixel 201 has a specific intensity and each pixel 201 appears with a specific shade of grey corresponding to that specific intensity. Illustration 200 may serve as an exemplary grayscale illustration that may be encoded on a surface utilizing method 100 of FIG. 1.

With reference to FIG. 1, according to step 102, an initial position of the light source may be specified by a user or received from a user. The initial position of the light source may be defined based on a coordinate system that may be defined relative to the target surface, where the origin of the coordinate system may be, for example placed on one corner of the target surface.

According to one exemplary implementation, the coordinate system may be a Cartesian coordinate system and the initial position of the light source may be specified using three numerical coordinates of x, y, and z. For example, x-coordinate and y-coordinate may specify the position of the light source on the plane of the target surface, and z-coordinate may specify the perpendicular distance of the light source from the plane of the surface. For example, the target surface may be a wall and the z-coordinate may specify the perpendicular distance of the light source from the wall.

Figure 2B:
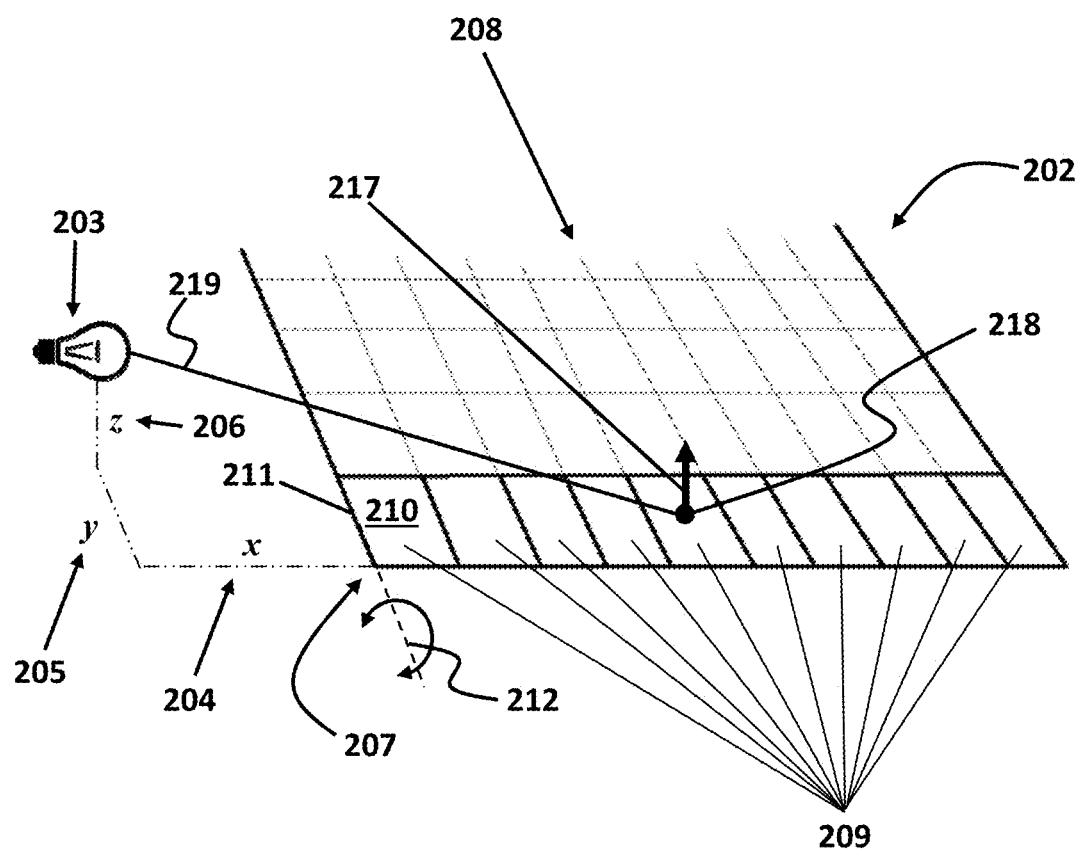
FIG. 2B illustrates an example of a surface divided into a grid of smaller surfaces, consistent with one or more exemplary embodiments of the present disclosure.

FIG. 2B, illustrates an exemplary surface 202 and the initial position of light source 203 that may be specified relative to exemplary surface 202. As shown in this figure, x-coordinate 204 and y-coordinate 205 may specify the position of light source 203 on the plane of target surface 202, and z-coordinate 206 may specify the perpendicular distance of light source 203 from the plane of the surface 202. In the exemplary implementation shown in FIG. 2B, the origin of the coordinate system is defined in one corner 207 of surface 202, however it should be noted that the origin of the coordinate system may be define in other points according to other exemplary implementations of the present disclosure. According to another exemplary implementation of the present disclosure, the coordinate system may be a coordinate system other than Cartesian coordinate system, such as polar, cylindrical, or spherical coordinate systems.

With further reference to FIG. 1, in step 103, a surface representing the target surface may be divided into a grid of smaller surfaces. Each smaller surface may represent a pixel of the grayscale image that is to be encoded on the target surface. The number of smaller surfaces may depend on the dimensions of the target surface and the number of pixels present in the grayscale image.

Referring to FIGS. 2A and 2B, according to an exemplary implementation, surface 202 may represent the target surface, on which grayscale illustration 200 is to be encoded. Surface 202 may be divided into a grid 208 of smaller surfaces representing the pixels of grayscale illustration 200. For example, pixels 201 of grayscale illustration 200 may be represented by smaller surfaces 209 on surface 202.

With further reference to step 103 of FIG. 1, once the surface representing the target surface is divided into a grid of smaller surfaces, then the orientation of each smaller surface relative to the light source may be manipulated, such that reflected light from each smaller surface has a reflection intensity substantially equal to the light intensity of the corresponding pixel of the grayscale illustration. Consistent with one or more exemplary embodiments, manipulating the orientation of each smaller surface with respect to the light source may include rotating each smaller surface about an axis. In some exemplary implementations, each smaller surface may be in a form of a rectangular or square surface with four edges and the axis about which each smaller surface may be rotated, may be defined on one of the four edges of each smaller surface that is the closest to the light source. Not bound by any particular theory, since the reflection intensity may depend on the angel at which the incoming light is shone on each smaller surface, therefore an angle of rotation may be obtained for each smaller surface, at which the reflection intensity of the light reflected from each smaller surface may be equal to the intensity of the corresponding pixel of that smaller surface in the grayscale illustration.

In the exemplary implementation shown in FIG. 2B, manipulating the orientation of smaller surface 210 means rotating smaller surface 210 about axis 212 defined on edge 211 of smaller surface 210, since edge 211 is closer to the light source 203.

Figure 2C:
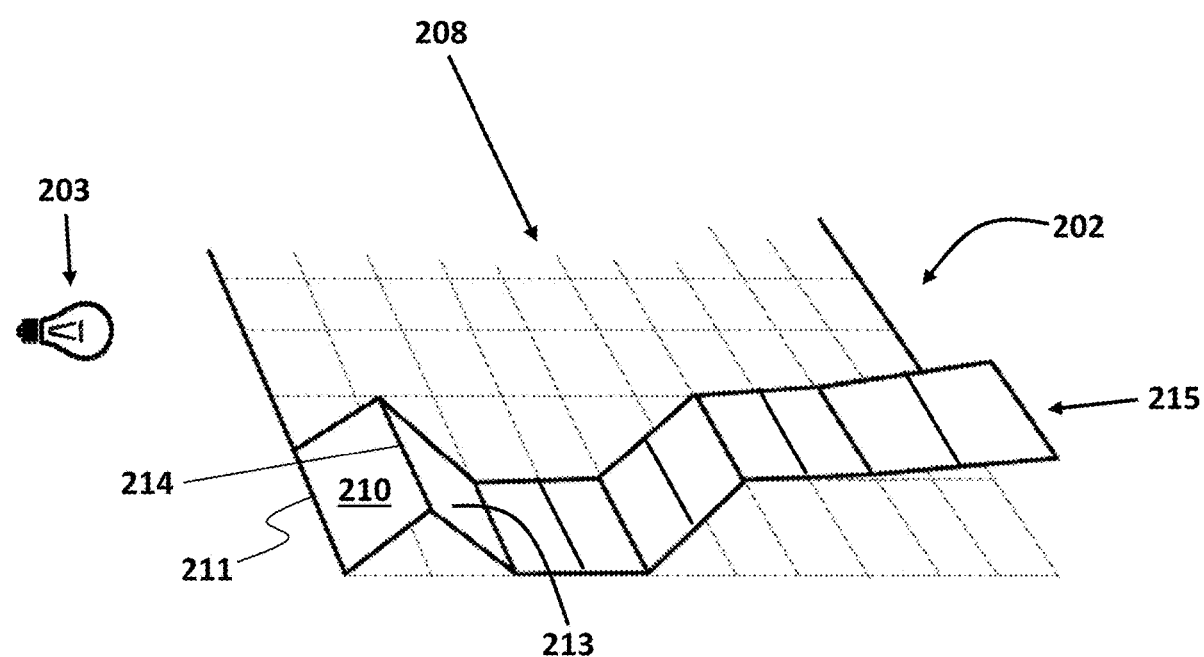
FIG. 2C illustrates a three dimensional row generated according to principles consistent with one or more exemplary embodiments of the present disclosure.

Referring to FIG. 2C, a next smaller surface in one row of grid 208 of smaller surfaces defined on surface 202, for example smaller surface 213 may be rotated on its mutual edge 214 with smaller surface 210 since edge 214 is the closest edge of smaller surface 213 to the light source 203 and other subsequent smaller surfaces may be rotated on their mutual edge with their previous smaller surface. Referring to FIG. 2C, a three dimensional row 215 may be created by orienting the smaller surfaces on that row and a similar process may be carried out for other rows of grid 208 in order to generate a three dimensional surface.

Figure 2D:
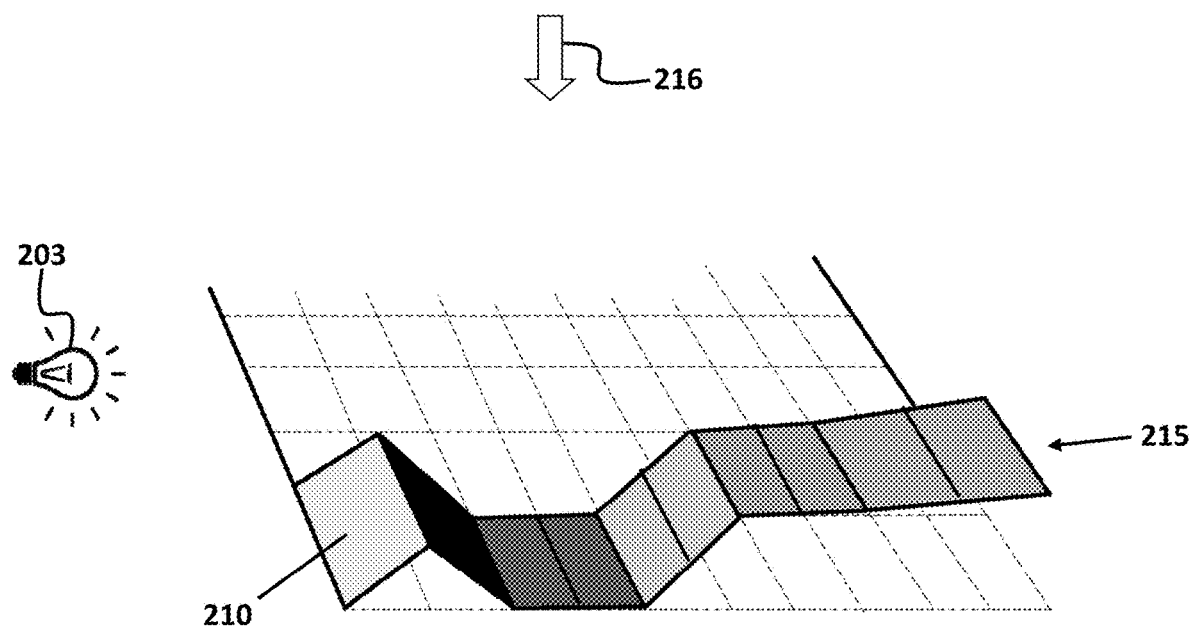
FIG. 2D illustrates a three dimensional row generated according to principles consistent with one or more exemplary embodiments of the present disclosure with light source shining light thereon.

Referring to FIGS. 2A and 2D, once light source 203 is turned on, each smaller surface on row 215 may reflect the received light from the light source 203 with a different intensity based on the orientation of that smaller surface. Smaller surfaces with similar orientations with respect to light source 203 may reflect the light with similar intensities. An observer 216 may see each smaller surface with a similar shade of gray as the corresponding pixel of that smaller surface in the grayscale image 200. For example, smaller surface 210 may be visible to the viewer with the same light intensity (i.e., shade of gray) as pixel 215 of the grayscale image 200.

Figure 3A:
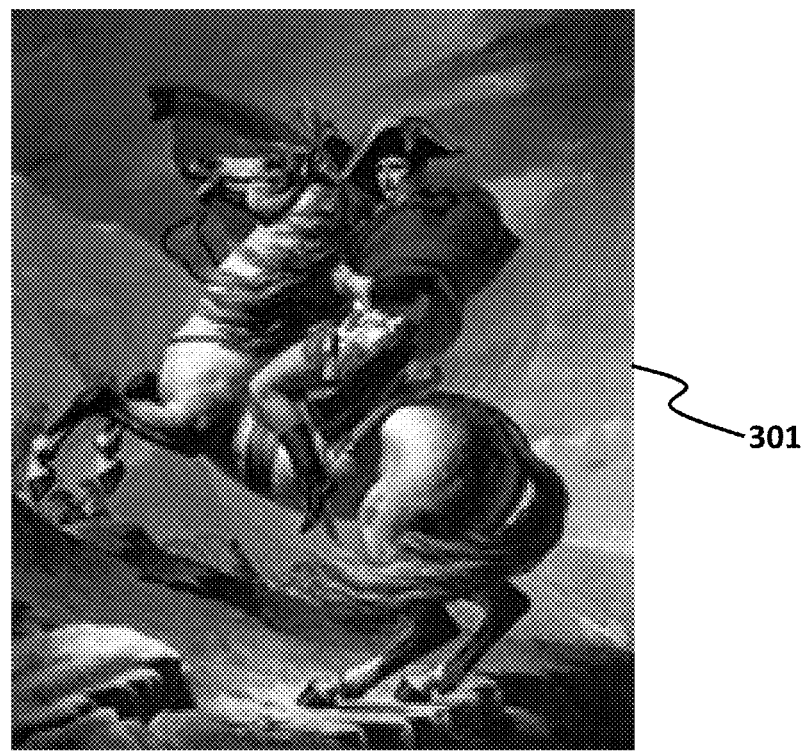
FIG. 3A illustrates an exemplary grayscale image to be encoded on a surface, consistent with one or more exemplary embodiments of the present disclosure.
Figure 3B:
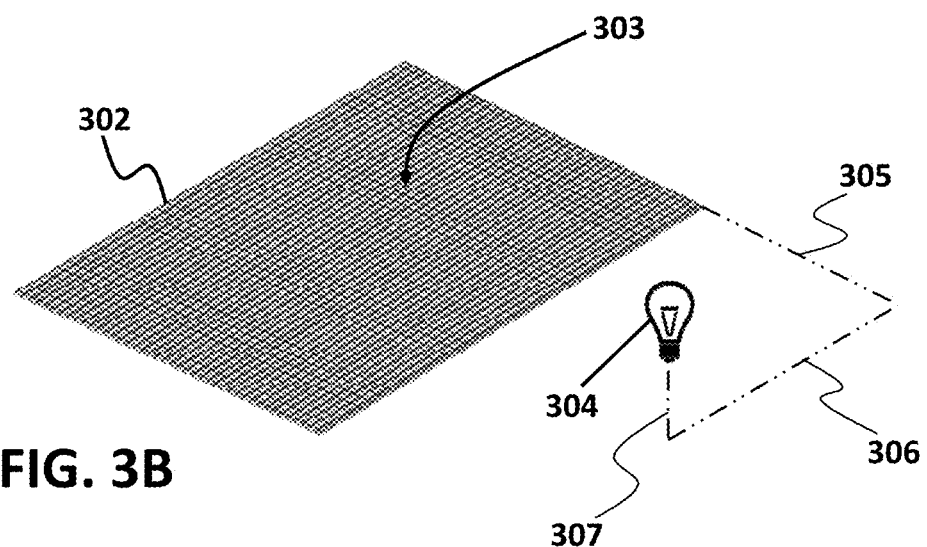
FIG. 3B illustrates an example of a surface divided into a grid of smaller surfaces, consistent with one or more exemplary embodiments of the present disclosure.
Figure 3C:
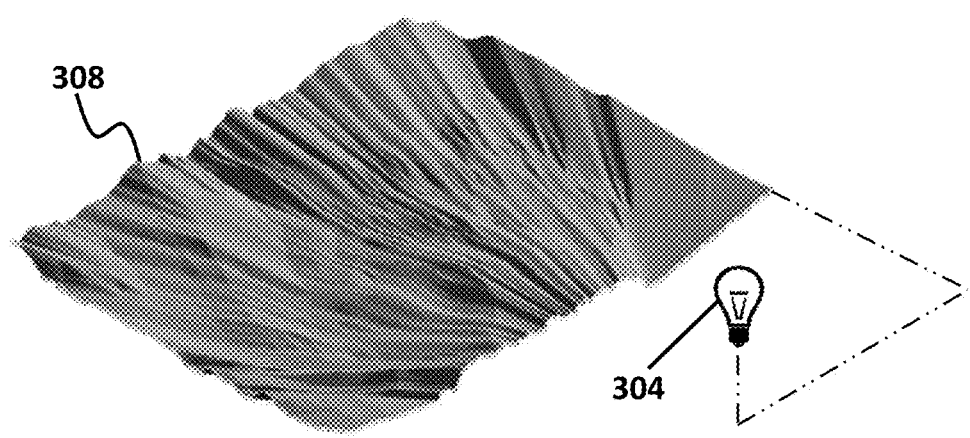
FIG. 3C illustrates a generated three dimensional surface, consistent with one or more exemplary embodiments of the present disclosure.
Figure 3D:
FIG. 3D illustrates an exemplary target surface with an exemplary illustration encoded thereon, consistent with one or more exemplary embodiments of the present disclosure.

FIGS. 3A to 3D illustrate exemplary implementations of method 100 of FIG. 1 to encode an exemplary grayscale image 301 onto a target surface 302 with predefined dimensions. Based on the dimensions of surface 302 and number of pixels of image 301, surface 302 may be divided into a grid 303 of smaller surfaces representing the pixels of image 301. An initial position of a light source 304 may be specified with three coordinate numbers x 305, y 306, and z 307. The orientation of each smaller surface on surface 302 may then be manipulated and changed such that the reflection intensity of reflected light from each smaller surface is equal to the intensity of the corresponding pixel of the greyscale illustration 201 once light is shone on surface 302 from light source 304, as a result a three dimensional surface 308 may be obtained. Referring to FIG. 3D, once light is shone on the three dimensional surface 308 from the light source 304, the encoded image on the surface 308 may be visible to a viewer standing in front of the target surface 308.

With further reference to FIG. 1, referring to step 104, once the three dimensional surface is generated according to step 103, the generated three dimensional surface may be used as a template to make the target surface out of a material such as wood, stone, plaster, polymeric materials, etc.

According to an exemplary embodiment, the generated three dimensional surface may be converted to a readable code for a computer-controlled cutting machine that may be utilized to carve the three dimensional surface on the target surface made of a material capable of being carved, such as wood.

According to another exemplary implementation, the generated three dimensional surface may be sent to a three dimensional printer that may print the target surface out of a material, such as a polymeric material.

According to another exemplary implementation, the generated three dimensional surface may be utilized to make a mold that may be used in a molding process to make the target surface out of a material such as plaster or polymeric materials.

Figure 4:
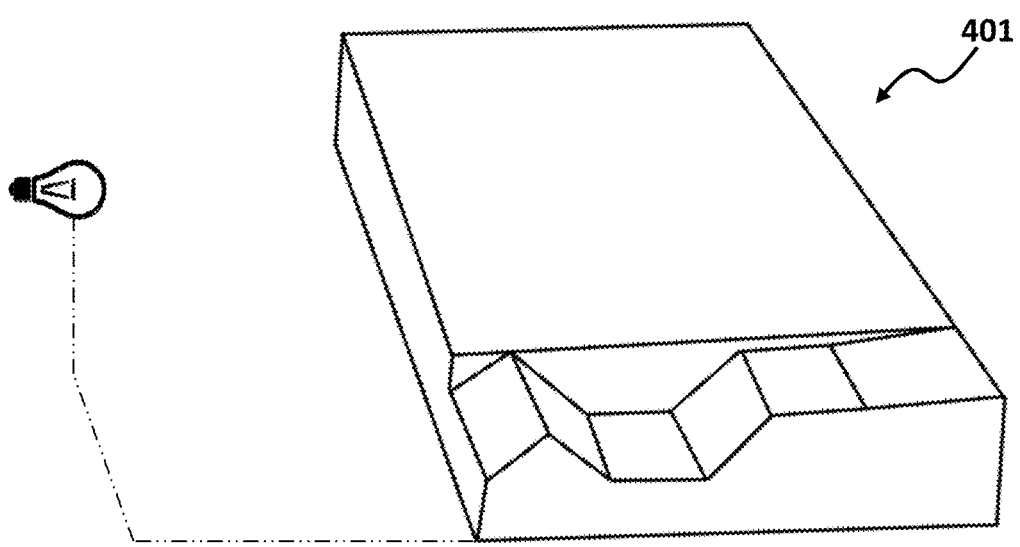
FIG. 4 illustrates an exemplary slab made using three dimensional row of FIG. 2D as a template, consistent with one or more exemplary embodiments of the present disclosure.

FIG. 4 illustrates an exemplary slab 401 made of a material such as wood, stone, plaster, polymeric materials, etc. Referring to FIGS. 2D and 4A, the generated three dimensional row 215 may be formed on slab 401 by either carving slab 401 by a cutting machine or by three dimensional printing of the entire slab 401 with the generated three dimensional row 215 patterned on it. In another implementation, slab 401 may be made by a molding process, such as injection molding.

Figure 5A:
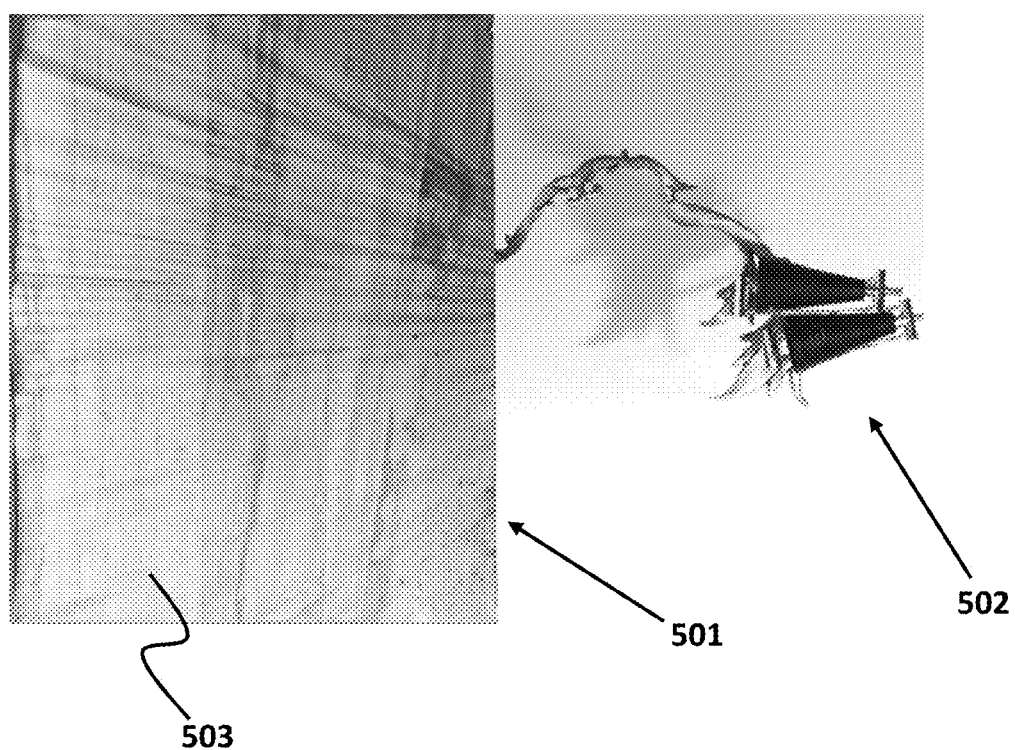
FIG. 5A illustrates a wooden slab with an illustration encoded thereon, consistent with one or more exemplary embodiments of the present disclosure.

FIG. 5A illustrates an exemplary wooden slab 501 with an illustration encoded thereon. Light sources 502 may be positioned at their specified positions near the wooden slab 501 with the target surface 503 thereon. As can be seen in this figure, when light sources 502 are turned off no illustration is visible on the target surface 503.

Figure 5B:
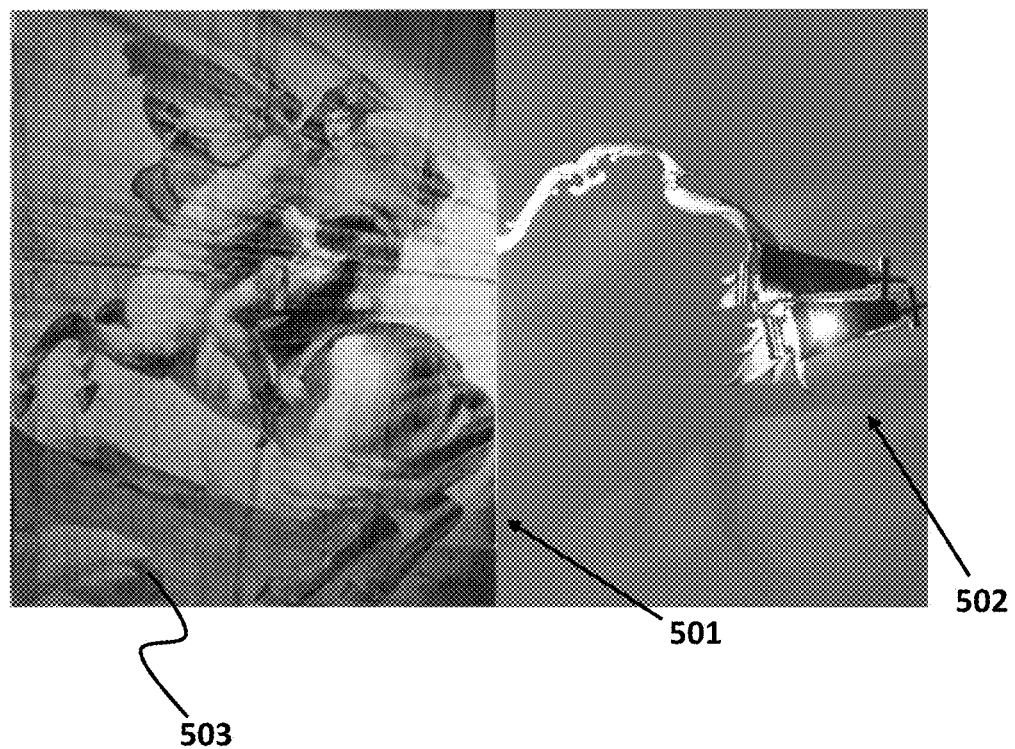
FIG. 5B illustrates the wooden slab of FIG. 5A with light shone thereon, consistent with one or more exemplary embodiments of the present disclosure.

FIG. 5B illustrates the exemplary wooden slab 501 with the light sources 502 turned on and the light shining on the target surface 503 revealing the encoded illustration on the target surface.

Figure 6:
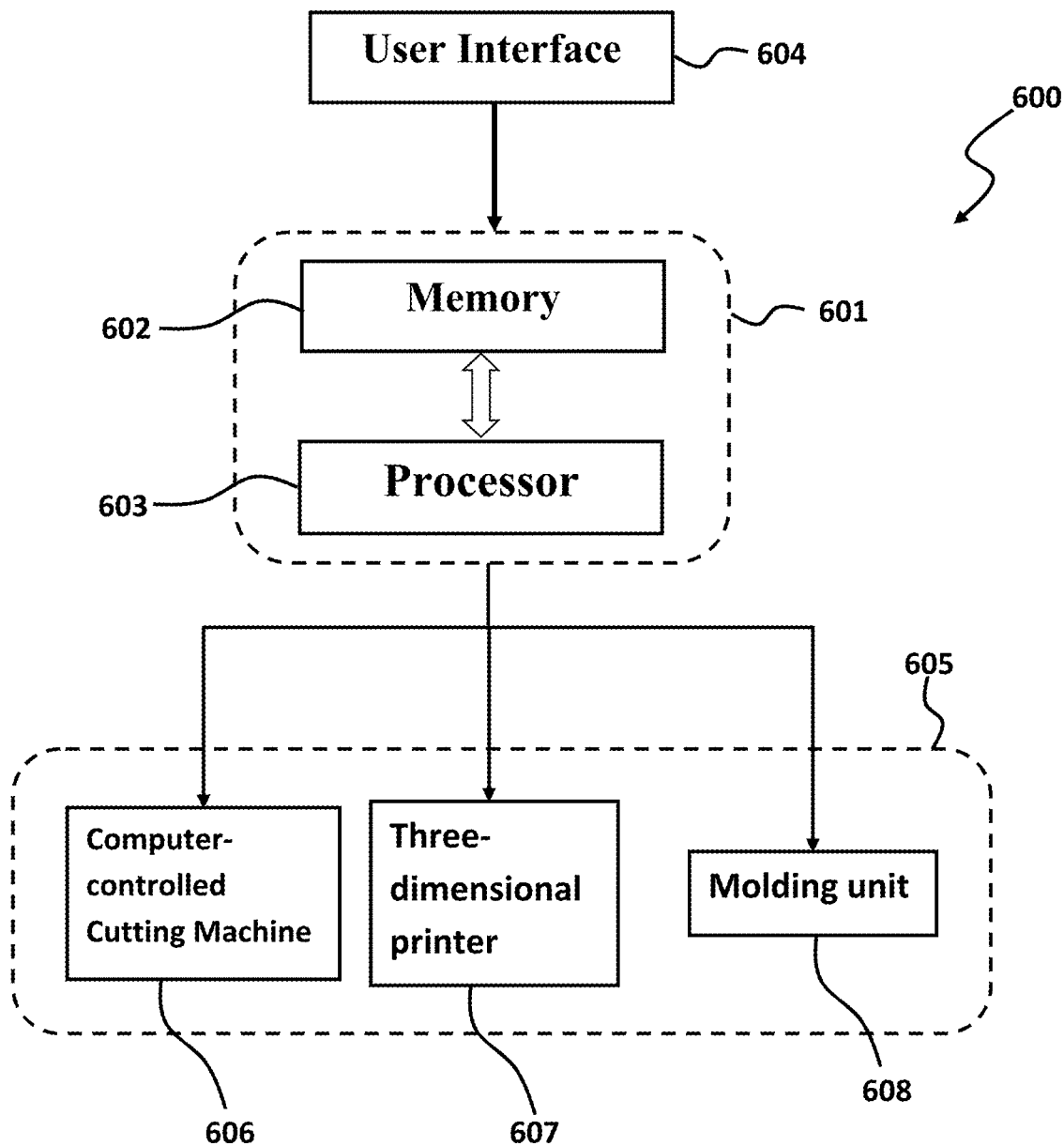
FIG. 6 illustrates a system for encoding illustrations on a target surface, consistent with one or more exemplary embodiments of the present disclosure.

FIG. 6 illustrates system 600 configured to be an exemplary implementation of method 100 of FIG. 1. Referring to FIG. 6, system 600 may include a computing unit 601 having a memory 602 and a processor 603; a user interface 604; a surface formation unit 605 that may include a computer-controlled cutting machine 606, a three dimensional printer 607, and a molding unit 608.

Referring to FIG. 6, in an exemplary embodiment, a user may use user interface 604 to specify a position for the light source and dimensions of a target surface. The position of the light source and the dimensions of the target surface along with the illustration that is to be encoded on the target surface may be stored on memory 602 of computing unit 601.

In an exemplary implementation, memory 602 may further include executable instructions that may include but are not limited to executable instructions for causing processor 603 to receive the illustration, the position of light source, and dimensions of the target surface; convert the received illustration into a grayscale illustration; divide the target surface into a grid of smaller surfaces based on the dimensions of the target surface and number of pixels of the illustration; calculating an angle between the surface normal of each smaller surface and a line from the surface point to the light source, such that the reflection intensity of reflected light from each smaller surface at the calculated angle is substantially equal to the light intensity of the corresponding pixel of the greyscale illustration; and generate a three dimensional surface from the smaller surfaces that are oriented with the calculated angles relative to the light source.

Referring to FIGS. 2B and 6, each smaller surface 209 may have a surface normal 217 and a surface point 218. Processor 603 may utilize a light reflection model to calculate an incoming light angle, which may be defined as the angle between the surface normal 217 and a line 219 from the surface point 218 to the light source 203. As used herein, surface point means a point in the center of each smaller surface.

Referring to FIG. 6, once the three dimensional surface is generated by the processor it may be sent to surface formation unit 605. In an implementation, surface formation unit 605 may include a computer-controlled cutting machine 606 that may be configured to receive the generated three dimensional surface as a readable code and carve the generated three dimensional surface onto the target surface which may be made of a material capable of being carved, such as wood or stone. In another exemplary implementation, surface formation unit 605 may include a three dimensional printer 607 that may be configured to receive the generated three dimensional surface as a readable code and print the generated three dimensional surface out of a material capable of being used in a three dimensional printer, such as polymer composites. In another exemplary implementation, surface formation unit 605 may include a molding unit 608 where a mold may be created out of the generated three dimensional surface and then the created mold may be utilized in a molding process, such as injection molding.

In an exemplary embodiment, utilizing the method for encoding illustrations on a target surface as was described herein in detail may lead to producing an article having an illustration encoded thereon.

What is claimed is:

1. A method for encoding an illustration on a target surface, the method comprising:
    converting the illustration into a grayscale illustration having a plurality of pixels, wherein each pixel has a light intensity;
    specifying a position of a light source relative to the target surface;
    generating a three dimensional surface having a grid of smaller surfaces thereon, wherein each smaller surface represents a corresponding pixel of the grayscale illustration, wherein generating the three dimensional surface comprises changing an orientation of each smaller surface with respect to the specified position of the light source such that reflected light from each smaller surface has a reflection intensity equal to the light intensity of the corresponding pixel of the grayscale illustration;
    forming the target surface out of a material using the generated three dimensional surface as a template; and
    making the illustration visible responsive to a light shining on the formed surface from the light source at the specified position.

2. The method according to claim 1, further comprising making the illustration invisible responsive to the light shining on the formed surface from the light source with any position other than the specified position.

3. The method according to claim 1, wherein each smaller surface has a surface normal, a surface point, and four edges, wherein generating the three dimensional surface includes:
    rotating each smaller surface about an axis, wherein each smaller surface is rotated to reach an angle between the surface normal of each smaller surface and a line from the surface point to the light source, wherein the reflection intensity of reflected light from each smaller surface at the reached angle is equal to the intensity of the corresponding pixel of the grayscale illustration,
    wherein the axis of each smaller surface is defined on an edge of each smaller surface that is closer to the light source.

4. The method according to claim 1, wherein making the target surface out of a material includes carving the material using the generated three dimensional surface as the template.

5. The method according to claim 1, wherein making the target surface out of a material includes three dimensional printing of the generated three dimensional surface out of the material.

6. The method according to claim 1, wherein making the target surface out of a material includes molding the target surface based on a mold created out of the generated three dimensional surface.

7. The method according to claim 1, wherein changing the orientation of each smaller surface with respect to the specified position of the light source comprises rotating each smaller surface about an axis, wherein each smaller surface is rotated to reach an angle between the surface normal of each smaller surface and a line from the surface point to the light source, wherein the reflection intensity of reflected light from each smaller surface at the reached angle is equal to the intensity of the corresponding pixel of the grayscale illustration.

8. A system for encoding an illustration on a target surface, wherein the illustration is visible when light is shone on the surface from a light source with a predetermined position, the system comprising:
   a processor;
   a memory storing executable instructions for causing the processor to:
      convert the illustration into a grayscale illustration having a plurality of pixels, wherein each pixel has a light intensity;
      receive a position of the light source;
      divide the target surface into a grid of smaller surfaces, wherein each smaller surface has a surface normal and a surface point;
      calculate an angle between the surface normal of each smaller surface and a line from the surface point to the light source, wherein the reflection intensity of reflected light from each smaller surface at the calculated angle is equal to the light intensity of the corresponding pixel of the grayscale illustration;
      generate a three dimensional surface from the smaller surfaces, wherein each smaller surface is oriented with the calculated angle with respect to the light source; and
   a surface formation unit configured to form the target surface out of a material using the generated three dimensional surface as a template,
   wherein the processor is further configured to convert the three dimensional surface into a readable code by the surface formation unit.

9. The system according to claim 8, wherein the surface formation unit includes a computer-controlled cutting machine configured to receive the readable code and carve the three dimensional surface on the material.

10. The system according to claim 8, wherein the surface formation unit includes a three dimensional printer configured to receive the readable code and print the generated three dimensional surface.

11. A method for encoding an illustration on a target surface, the method comprising:
   converting the illustration into a grayscale illustration having a plurality of pixels, wherein each pixel has a light intensity;
   specifying a position of a light source relative to the target surface;
   generating a three dimensional surface comprising a grid of smaller surfaces, wherein each smaller surface of the grid of smaller surfaces represents a corresponding pixel of the grayscale illustration, wherein generating the three dimensional surface comprises rotating each smaller surface with respect to the light source, wherein the reflection intensity of reflected light from each rotated smaller surface is equal to the light intensity of the corresponding pixel of the grayscale illustration; and
   forming the target surface out of a material using the generated three dimensional surface as a template.

12. The method according to claim 11, further comprising mounting the light source at the specified position relative to the formed target surface.

13. The method according to claim 11, wherein rotating each smaller surface with respect to the light source comprises rotating each smaller surface about an axis defined on an edge of each smaller surface that is closer to the light source.

14. The method according to claim 11, wherein each smaller surface has a surface normal, a surface point, and four edges, wherein rotating each smaller surface with respect to the light source comprises:
   rotating each smaller surface about an axis, wherein each smaller surface is rotated to reach an angle between the surface normal of each smaller surface and a line from the surface point to the light source, wherein the reflection intensity of reflected light from each smaller surface at the reached angle is equal to the intensity of the corresponding pixel of the grayscale illustration.

* * * * *